(12) United States Patent
Levinski et al.

(10) Patent No.: US 8,243,273 B2
(45) Date of Patent: Aug. 14, 2012

(54) ENHANCED OVL DUMMY FIELD ENABLING "ON-THE-FLY" OVL MEASUREMENT METHODS

(75) Inventors: Vladimir Levinski, Nazareth Ilit (IL); Michael Adel, Zichron Ya'akov (IL); Mark Ghinovker, Yokneam Ilit. (IL); Alexander Svizher, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 440 days.

(21) Appl. No.: 12/455,640

(22) Filed: Jun. 4, 2009

(65) Prior Publication Data
US 2009/0303482 A1 Dec. 10, 2009

Related U.S. Application Data

(60) Provisional application No. 61/058,842, filed on Jun. 4, 2008.

(51) Int. Cl.
*G01B 11/00* (2006.01)

(52) U.S. Cl. ........ 356/400; 356/420; 356/401; 356/399; 356/620; 430/4; 430/22; 430/77; 382/145; 382/151; 438/401

(58) Field of Classification Search .............. 356/400, 356/420, 620, 401, 399; 438/401; 355/53, 355/55, 77; 430/5, 22, 77; 382/145, 149–151
See application file for complete search history.

(56) References Cited

U.S. PATENT DOCUMENTS

| | | | |
|---|---|---|---|
| 6,566,885 B1 * | 5/2003 | Pinto et al. | 356/237.2 |
| 6,899,982 B2 * | 5/2005 | McArthur et al. | 430/30 |
| 7,346,878 B1 | 3/2008 | Cohen et al. | |

* cited by examiner

*Primary Examiner* — Kara E. Geisel
*Assistant Examiner* — Iyabo S Alli
(74) *Attorney, Agent, or Firm* — Suiter Swantz pc llo

(57) ABSTRACT

A semiconductor wafer may include a dummy field configured to enable overlay measurements. The enhanced dummy field may include a plurality of encoding blocs that enable OVL measurements to be made throughout the enhanced dummy field.

21 Claims, 9 Drawing Sheets

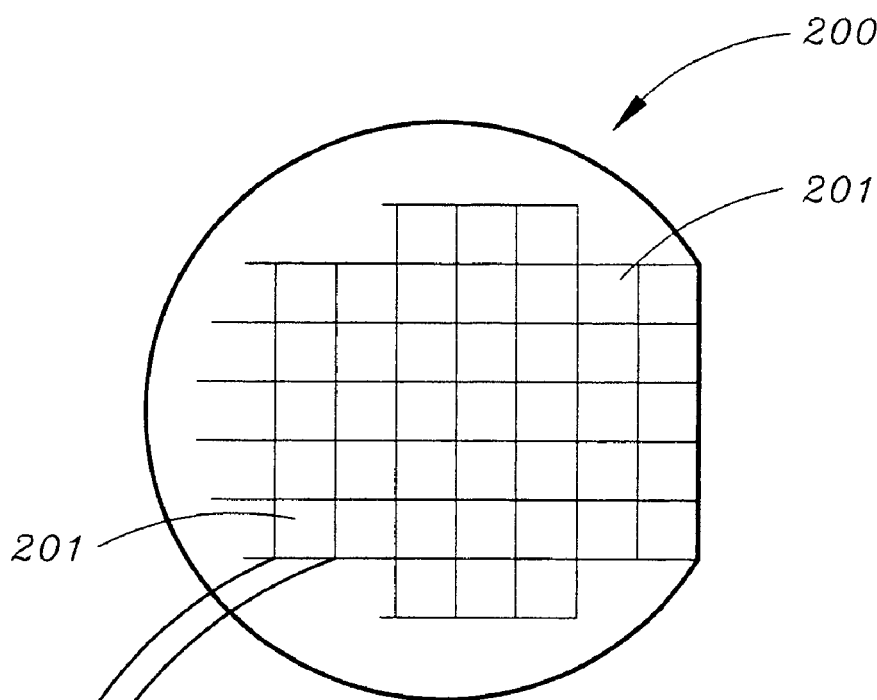
FIG. 2a
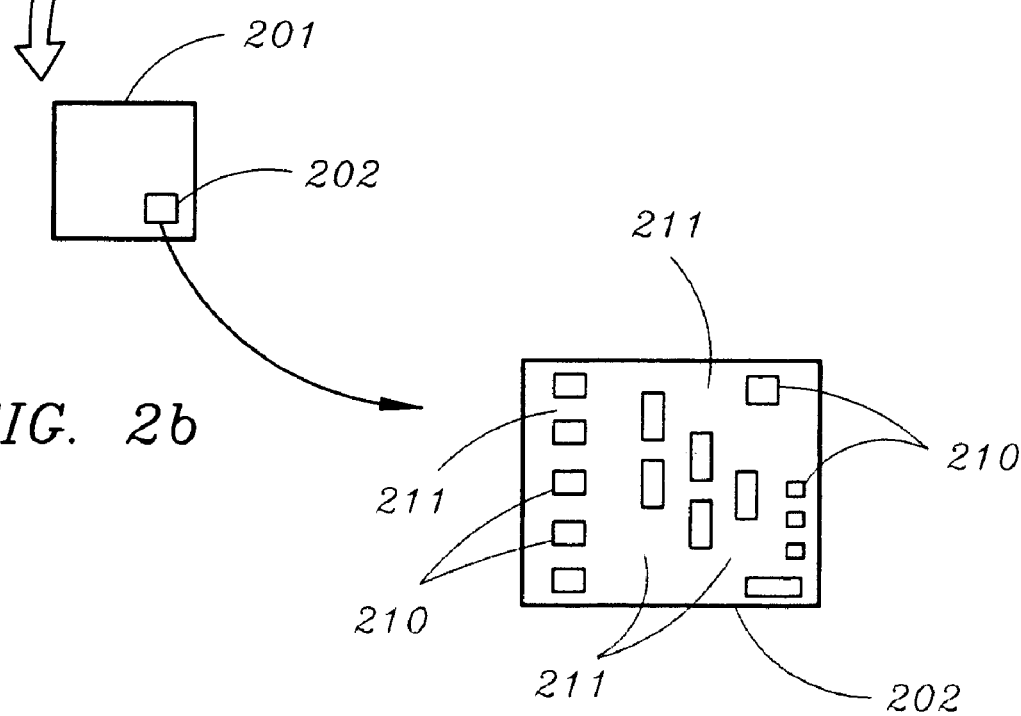
FIG. 2b
FIG. 2c

ENHANCED OVL DUMMY FIELD ENABLING "ON-THE-FLY" OVL MEASUREMENT METHODS

CROSS REFERENCE TO RELATED APPLICATIONS

The present application claims the benefit under 35 U.S.C. §119(e) of U.S. Provisional Patent Application Ser. No. 61/058,842, entitled "ENHANCED OVL DUMMY FIELD ENABLING "ON-THE-FLY" OVL MEASUREMENT METHODS," filed Jun. 4, 2008, which is incorporated herein by reference. This application is related to the following U.S. Patent Applications and Patents: U.S. Pat. No. 7,317,531, entitled "APPARATUS AND METHODS FOR DETECTING OVERLAY ERRORS USING SCATTEROMETRY"; U.S. Patent Publication No. 2004/0233440, entitled "APPARATUS AND METHODS FOR DETECTING OVERLAY ERRORS USING SCATTEROMETRY"; U.S. Pat. No. 7,298,481, entitled "APPARATUS AND METHODS FOR DETECTING OVERLAY ERRORS USING SCATTEROMETRY"; U.S. Pat. No. 7,280,212, entitled "APPARATUS AND METHODS FOR DETECTING OVERLAY ERRORS USING SCATTEROMETRY"; U.S. Pat. No. 7,301,634, entitled "APPARATUS AND METHODS FOR DETECTING OVERLAY ERRORS USING SCATTEROMETRY"; U.S. Patent Publication No. 2004/0233442, entitled "APPARATUS AND METHODS FOR DETECTING OVERLAY ERRORS USING SCATTEROMETRY"; U.S. Pat. No. 7,242,477, entitled "APPARATUS AND METHODS FOR DETECTING OVERLAY ERRORS USING SCATTEROMETRY"; U.S. Pat. No. 7,289,213, entitled "APPARATUS AND METHODS FOR DETECTING OVERLAY ERRORS USING SCATTEROMETRY"; U.S. Patent Publication No. 2005/0195398, entitled "CONTINUOUSLY VARYING OFFSET MARK AND METHODS OF DETERMINING OVERLAY" U.S. Patent Publication No. 2007/0229829, entitled "APPARATUS AND METHODS FOR DETECTING OVERLAY ERRORS USING SCATTEROMETRY"; and U.S. patent application Ser. No. 11/926,603, entitled "APPARATUS AND METHODS FOR DETECTING OVERLAY ERRORS USING SCATTEROMETRY". All of the foregoing applications and patents are hereby incorporated by reference in their entirety.

TECHNICAL FIELD

The invention described herein relates generally to semiconductor inspection technologies. In particular, the invention refers to improved overlay metrology methods and devices using improved measurement fields for enabling a high degree of sensitivity to parameters of interest including overlay metrology measurements.

BACKGROUND

In semiconductor fabrication, alignment of the various layers in a chip substrate is crucial. Accordingly, wafers and die commonly are formed with a number of specialty constructed alignment targets (also known as overlay targets). Specific portions of the surface are dedicated to the formation of overlay targets. These dedicated portions of the surface are scattered about the surface of the wafer to provide as much information as possible. Unfortunately, these targets take up valuable space that could otherwise have been used to form active circuit elements and structures.

SUMMARY

In accordance with the principles of the present invention, improved scatterometry targets and methods are disclosed.

In general, the present invention is directed toward targets, measurement apparatuses, and methods enabling simultaneous illumination and data collection directed onto enhanced dummy fields to enable measurement of overlay between layers.

In one embodiment, a semiconductor wafer configured with an enhanced dummy field enabling overlay measurements is disclosed. The dummy field may be patterned into the wafer having a pattern of periodic overlay features encoded with overlay alignment information. Additionally, a set of semiconductor circuitry structures may be patterned in the dummy field.

Another embodiment may include an overlay error encoding bloc for measuring overlay error between two layers of a wafer surface. The bloc has a first layer formed on a substrate where the first layer includes a first two-dimensional array of periodically arranged metrology features having a first periodicity. A second layer may be formed over the first layer where the second layer includes a second two-dimensional array of periodically arranged metrology features having a second periodicity not the same as the first periodicity, the second array arranged over the first array of metrology features.

An embodiment includes a method for measuring the overlay in a semiconductor substrate. The method may include providing a substrate having a first layer formed over a second layer where the layers include an encoded dummy field with microcircuitry structures formed therein and comprising two overlying periodic patterns arranged on the first and second layers to form OVL encoding patterns that enable two dimensional overlay metrology measurements to be made. The substrate may be scanned and illuminated at various places in the dummy field to produce asymmetry signals associated with OVL encoding patterns. The asymmetry signals may be captured and processed to determine overlay offset between the first layer and the second layer enabling generation of a model of overlay error as a function of position on the substrate.

Another embodiment includes an apparatus suitable for measuring overlay in accordance with the principles herein. The apparatus may include an examination platform configured to secure a wafer under inspection, (the wafer including dummy fields encoded with overlay alignment information). The apparatus may further include an illumination system for illuminating portions of the wafer under inspection and a stage enabling movement of the wafer under inspection so that different portions of the moving wafer may be illuminated to generate an optical signal associated with surface patterns of the wafer under inspection, wherein said optical signal defines an asymmetry signal. Additionally, an optical system may be included for continuously receiving an asymmetry signal as the light beam moves over the wafer under inspection. The apparatus may include a detection system arranged to receive the asymmetry signal from the optical system and suitable for determining layer overlay on the wafer using the detected asymmetry signal information. A processor may be included to process data, including the asymmetry signal, for generating an overlay model across a substrate surface.

Other aspects and advantages will become apparent from the following detailed description and accompanying drawings which.

BRIEF DESCRIPTION OF THE DRAWINGS

The following detailed description will be more readily understood in conjunction with the accompanying drawings, in which:

FIGS. 2(a)-2(c) are simplified depictions of a portion of a semiconductor wafer substrate and an associated dummy field enabling overlay metrology in accordance with the principles of the invention.

It is to be understood that in the drawings like reference numerals designate like structural elements. Also, it is understood that the depictions in the Figures are not necessarily to scale.

DETAILED DESCRIPTION OF THE INVENTION

Reference will now be made in detail to the subject matter disclosed, which is illustrated in the accompanying drawings. The present technology has been particularly shown and described with respect to certain embodiments and specific features thereof. The embodiments set forth herein are to be taken as illustrative rather than limiting. It should be readily apparent to those of ordinary skill in the art that various changes and modifications in form and detail may be made without departing from the spirit and scope of the subject matter.

Figure 1:
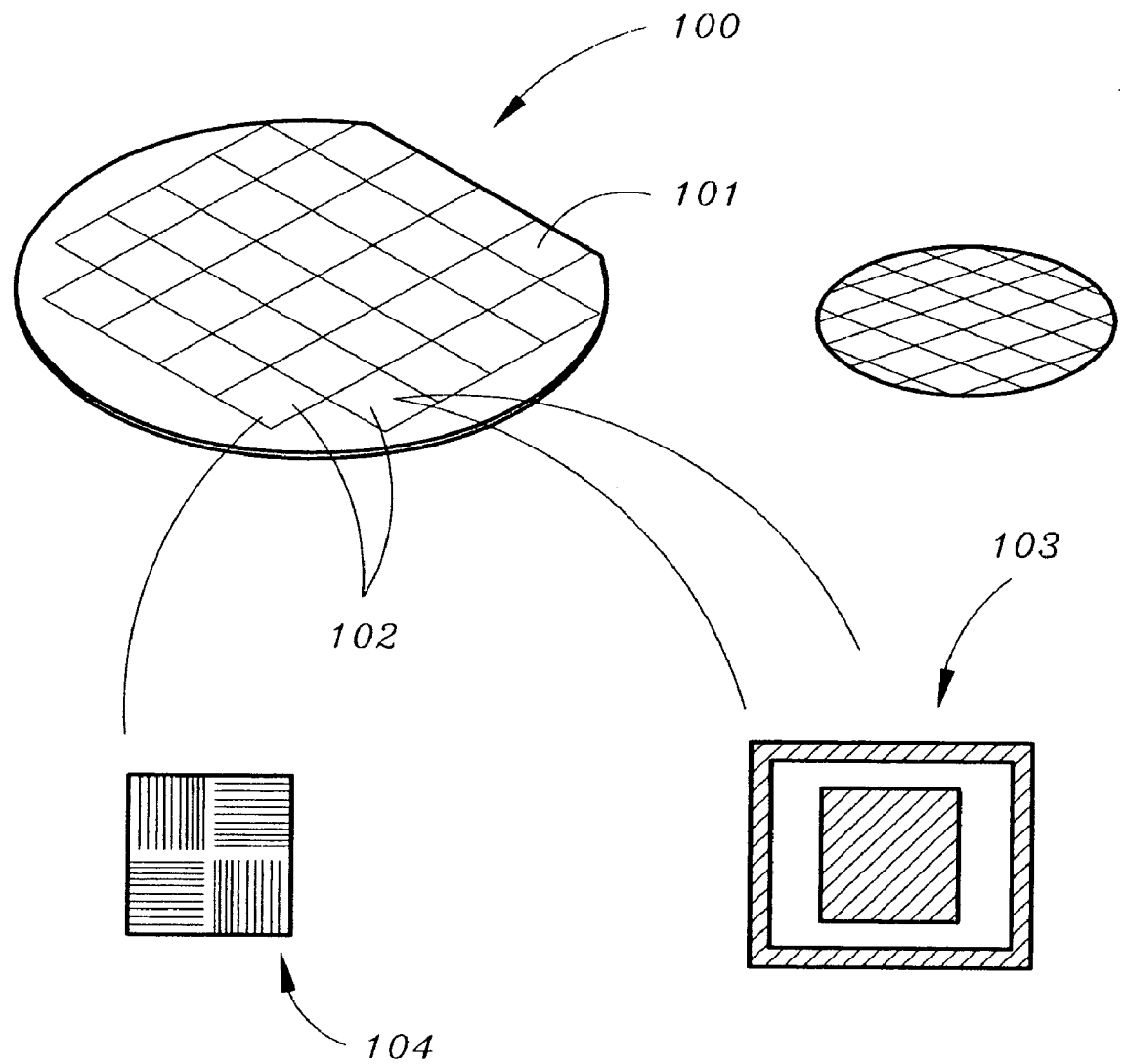
FIG. 1 illustrates a wafer including prior art BiB and scatterometry targets.

As referenced in FIG. 1, two main types of overlay targets have been used. One target variety includes so-called optically resolved type targets (such as BiB type targets and the like). Additionally, overlay targets can include so-called overlay scatterometry targets. FIG. 1 shows a wafer 100 having a series of die 101 formed thereon. Each die 101 has an arrangement of circuitry structures formed at various designated portions of the die. Selected portions 102 of the die are reserved for the placement of overlay targets. Target 103 provides an example of a schematically represented optically resolved target (such as a BiB type target). Target 104 provides an example of a schematically represented overlay scatterometry target.

Optically resolved targets are generally small targets that are optically acquired, focused upon, and measured to determine overlay measurements. As is known, one typical type of such a target is a so-called box in box (BiB) target where optical measurements are made of one box-like structure arranged inside another box-like structure, and the results of the measurements may be used to determine overlay error between two layers. This methodology suffers from many limitations, not the least of which is an upper limit posed by optical resolution of the targets. Another very problematic issue with such targets is the so-called MAM time delays caused by existing targeting arrangements. MAM time delays refer to "move-acquire-measure" delays known in the art. An inspector must align a wafer (or die), identify the targets, and then "move" to a target location, "acquire" the target (i.e., attain correct alignment, focus, and other optical acquisition parameters), and then lastly "measure" the target. All of these take time for each target. Because each wafer has 100's or even 1000's of targets that must be interrogated, this presents a significant bottleneck to existing semiconductor wafer processing. For example, using existing methods OVL wafer inspection takes at east an hour per wafer. The targeting information must be analyzed, typically offline, to ascertain alignment information and create a subsequent overlay map that characterizes the overlay error over an entire wafer (or die) surface.

So-called scatterometry targets may be employed to overcome some of the resolution problems encountered by optically resolved targets, but unfortunately, do not remedy the MAM time delays inherent in all target type OVL measurement approaches. Such OVL scatterometry targets may include rows of uniformly constructed and uniformly spaced single dimensional lines used to form periodic gratings arranged for providing scatterometry information. Typical prior art example targets include small target regions having periodic gratings arranged in two overlying layers configured to enable measurements of offset gratings for obtaining overlay metrology measurements.

Such periodic targets may require two layers with similarly oriented and/or identical periodic gratings formed one over the other. Typically, the layers of the targets are designed with a specified predetermined offset with respect to each other. This offset is invariant over the target. This enables scattering signals to be generated when the target is acquired by the measurement tool and illuminated by a light beam. An analysis of the scattering signal may enable highly accurate overlay metrology measurements.

Generally, several different targets are sequentially acquired, illuminated, focused upon, and then measurements of the scattering signals are then used to make overlay measurements. Typically, the several targets may provide enough information to enable a reasonable accurate model of overlay error to be made. This model enables a determination of alignment accuracy to be obtained for the various fabrication processes used to form the layers of a semiconductor wafer. The industry is moving toward smaller scale circuit structures thus requiring more demanding overlay accuracy and measurement accuracy.

However, generating increased accuracy of overlay models requires more targets. Unfortunately, this takes up valuable space and increases inspection times. Additionally, the targets force design choices in portions of the surface adjacent to the device areas that are not always optimal for the associated device circuitry due to their relatively large size. For example, the presence of a target may force a crowding of interconnects in an area to accommodate the placement of the target. Such crowding can result in cross-talk problems in the resulting interconnect lines. Other serious design complications caused by the presence of a number of targeting arrangements exist.

Additionally, existing targeting approaches and techniques are reaching resolution barriers imposed by the Rayleigh limit and other operational factors that seriously limit the accuracy of existing approaches. In general, prior art targeting arrays employ a multitude of different targets scattered over a wafer to enable accurate overlay measurements to be made. A typical targeting array may include a plurality of scatterometry targets arranged in complementary target pairs enabling measurements of both "x" offset and "y" offset. Some examples of prior art systems which rely on scatterometry techniques may be found in U.S. Pat. Nos. 5,867,276; 5,963,329; and 5,739,909, each of which are incorporated herein by reference. These patents describe using both spectrophotometry and spectroscopic ellipsometry to analyze periodic structures. Another reference describing scatterometry approaches is disclosed in U.S. patent application Ser. No. 11/525,320 entitled "Apparatus and Methods for Detecting Overlay Errors Using Scatterometry," which is incorporated herein by reference.

One limitation of such targets is that the illumination spots used to illuminate the target are actually "Airy disks" having portions of the optical signal that extend beyond the boundaries of each target and have the potential to generate Large amounts of signal "contamination" by illuminating considerable portions of nearby complementary targets or device areas. Such "cross-talk" may seriously degrade the fidelity and information content of the scattering signal. As indicated above, such approaches are also known to be slow. Because each target on the entire wafer (there may be hundreds or thousands of such targets) must be examined, it may take a considerable time to inspect an entire wafer.

During the fabrication of successive layers, alignment issues may become a serious concern. As discussed above, current measuring techniques used for determining overlay error are slow and suffer from accuracy limitations. Moreover, they require the use of very accurate and specialized optical and alignment technologies, which may be quite expensive. In general, the present system and method use enhanced dummy fields to replace the ordinary dummy fields used in the prior art. These enhanced dummy fields include arrays of specifically designed metrology features that are arranged in patterned scatterometry fields that, through interrogation, can be used to measure overlay. Associated illumination and measurement approaches may be used to enable the improved scatterometry methodologies and overlay metrology techniques disclosed herein. Such enhanced dummy fields can enable increased inspection speed, as well as provide a more detailed model of overlay displacement across a wafer or die resulting in increased overlay measurement sensitivity and accuracy. These enhanced dummy fields enable the prior art multiplicity of targets to be replaced with an enhanced dummy field that is placed in areas having no active circuitry patterns. Thus, the enhanced dummy field serves as measurement guideposts that measure overlay error Another advantage of the enhanced dummy field taught here is that the formation of the dummy field requires not significant alteration in the active circuitry patterns used to form circuit structures on the substrate. Additionally, because the dummy field extends over virtually all portions of the substrate surface, they provide overlay information from virtually all general areas of the surface, which gives far more information than the limited number of dedicated overlay targets used in the prior art. Moreover, this is done without disrupting the existing circuit patterns. Consequently, the enhanced pattern embodiments disclosed herein do not require the expensive, time consuming, and inefficient circuit redesign characteristic of the prior art which must accommodate the addition of dedicated overlay BiB and scatterometry targets.

FIGS. 2(a)-2(c) schematically depict a wafer 200 and selected portions of the wafer. The wafer 200 includes a plurality of die patterning regions also referred to here as 201. In one embodiment, the dice 201 may be in the process of being formed on the wafer 200. For purposes of illustration, the wafer 200 is shown with having a pair of fabrication layers formed thereon. A portion 202 of the die 201 is shown. In the depicted plan view, the dice may be each formed having many layers that include having a multitude of operative microcircuitry structures and elements 210 (also referred to as actively patterned regions) formed thereon with the intervening interstitial spaces (and edges) being occupied with at least one enhanced dummy field region 211. The actively patterned regions 210 or "active" regions of the substrate are those regions of the wafer that are to be patterned in the relevant layers to form the operational devices and structures of a semiconductor die (i.e., transistors, diodes, IC devices, interconnect lines and connections, vias, and other microcircuitry elements and structures). The enhanced dummy field regions 211 formed in the non-active regions (e.g., between the actively patterned regions 210) do not contain devices and patterns that result in active structures. In general, the dummy field regions 211 include the background patterning of the surface onto which the microcircuitry elements are formed.

Thus, for a set of layers formed on a substrate 200, the layers are patterned to define actively patterned regions and the enhanced dummy field areas. The layers of dummy field areas 211 are patterned such that light incident on the dummy field does not create excessive tight scattering and cross talk regarding the adjacent actively patterned areas (also referred to herein as device areas). This may be for creating a dummy pattern having a density similar to that of the adjacent active device regions but containing no patterning information. Thus, dummy patterns may be formed for reducing the noise in signals used to form patterns on the device areas. In this way, a dummy field may be used to increase the fidelity of adjacent microcircuitry patterns.

An enhanced dummy field 211 may advantageously cover a substantial portion of a wafer surface. In many cases dummy fields cover portions of the surface in the range of about 15-20% of the surface of a die. Since the enhanced dummy field described herein is encoded with overlay information, the same substantial portion of the wafer surface is encoded with overlay information. This means a much larger portion of the surface (e.g., about 15-20% of surface) may be interrogated to obtain overlay information instead of having to rely on a finite number of dedicated targets that many not be located in desired locations.

An overlay target may be replaced by (or supplemented with) the enhanced dummy fields described herein. Instead of using multiple dedicated overlay targets, the "large" areas provided by the previously unused dummy field areas may be utilized to measure overlay. Thus, entire portions of the substrate may be patterned to form OVL encoding blocs that characterize enhanced dummy fields and enable overlay measurements to be made.

Because the dummy fields are located all over the surface of the wafer, they may present an ideal medium to better characterize overlay across an entire surface of a wafer. Thus, OVL measurements are no longer limited to measuring at a few selected locations defined by a few overlay targets. Because the enhanced dummy field is located in all regions of the wafer, an opportunity is presented to characterize the overlay in many portions of the surface not previously accessible. Moreover, by patterning active structures over the enhanced dummy layer, no changes need be made to existing microcircuitry patterns in order to accommodate the addition overlay metrology features (OVL encoding blocs). This is in direct contrast to previous methods for overlay targets which required redesign of the circuit patterns in order to accommodate the need for a multitude of targets at the required locations. The enhanced dummy pattern is merely part of the background pattern, which has the circuitry pattern formed over it.

Instead of a target by target measurement of overlay targets, embodiments included herein only require an examination of a portion of the enhanced dummy pattern to identify the local overlay error. Rather than having to identify a target, move to the target, stop on the target, then focus and image the target to take a measurement, a portion of the enhanced dummy field is scanned and measurements are taken and overlay determined. This may all take place in real-time or nearly real-time. This methodology enables measurements to be obtained from points across the entire wafer and to be analyzed, often in times on the order of about 15 seconds. When compared to the prior times, often nearly an hour, some of the advantages of the methodology herein become immediately apparent.

Figure 3:
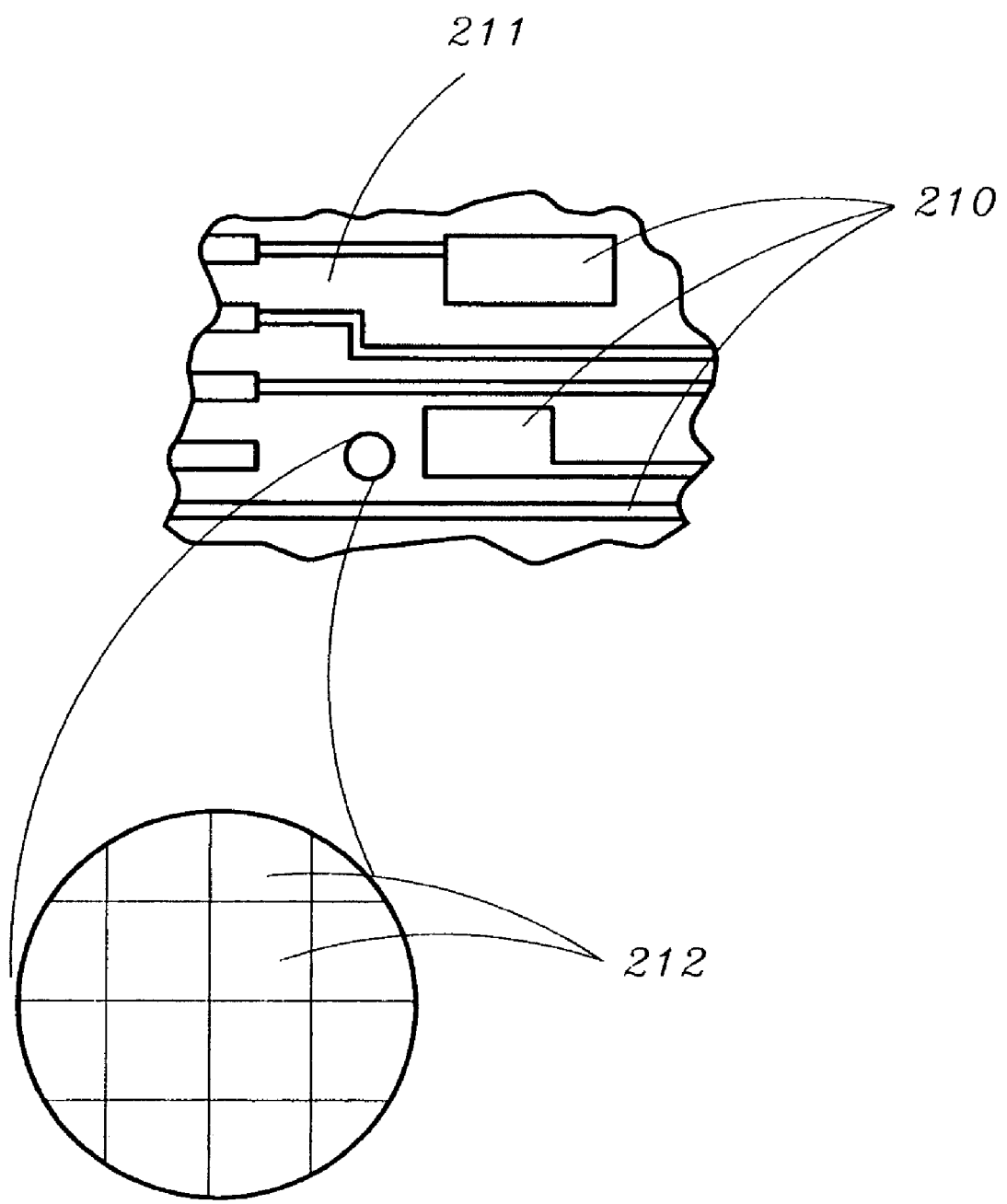
FIG. 3 is a simplified diagram illustrating an OVL encoding bloc of the dummy field of the present invention.

In a related illustration, FIG. 3 depicts an embodiment of the enhanced dummy field 211 formed on a wafer 200. A wafer 200 is shown having a schematically depicted microcircuitry pattern 210 (a simplified pattern of figuratively depicted "active" elements) formed with an enhanced dummy field 211. The enhanced dummy field 211 comprises a plurality of OVL encoding blocs 212 (also schematically depicted here). This enhanced dummy field 211 may be used to measure the overlay error between a pair of layers formed on a wafer.

An enhanced dummy field 211 may include many OVL encoding blocs 212 formed in the enhanced dummy field 211, which may cover most of the non-actively patterned portions of a die. An encoding bloc may be formed by known semiconductor processing techniques. Generally, a portion of a dummy field includes a few encoding blocs 212 of a suitable size. In one example, the size is chosen such that the OVL encoding bloc 212 is smaller than the illuminating beam size. Additionally, an OVL block size may be chosen so that variability (in-field OVL variability) is less than the required OVL measurement accuracy. This enables measurement of OVL variability within a chip area by comparing OVL values for different blocs. Each bloc may be used for independent OVL measurement and may be organized as a set of areas with different predefined OVL values (discrete model). Alternatively, the OVL blocs may be configured with continuously varying OVL offsets beginning from the center of the bloc area.

In the first case, two different layers may be formed over each other. Each layer may include a two-dimensional array of OVL features (also formed over each other). These features may be small easily identifiable structures formed in/and or on a layer. One example of such a feature may be an array of small dot shaped structures that demonstrate good contrast with the surrounding portions of the layer. Such structures may include pillars, vias, and/or other high contrast features including a wide range of shapes (dots, bars, squares, triangles, etc.). In one example, each of the arrays may be designed with the same pitch between features and a known offset between the two layers (arrays) to form a series of discrete metrology arrays. Each array may have a center of symmetry. Thus, the first array may have a first center of symmetry and the second array may define a second center of symmetry. The known offset between the first and second arrays may correspond to an offset between the respective centers of symmetry. Using scatterometry techniques, the degree of offset between the two centers of symmetry may be determined. This offset from the intended (or designed) offset may demonstrate a shift in alignment between the first and second layers and may be indicative of an overlay offset error.

Figure 4:
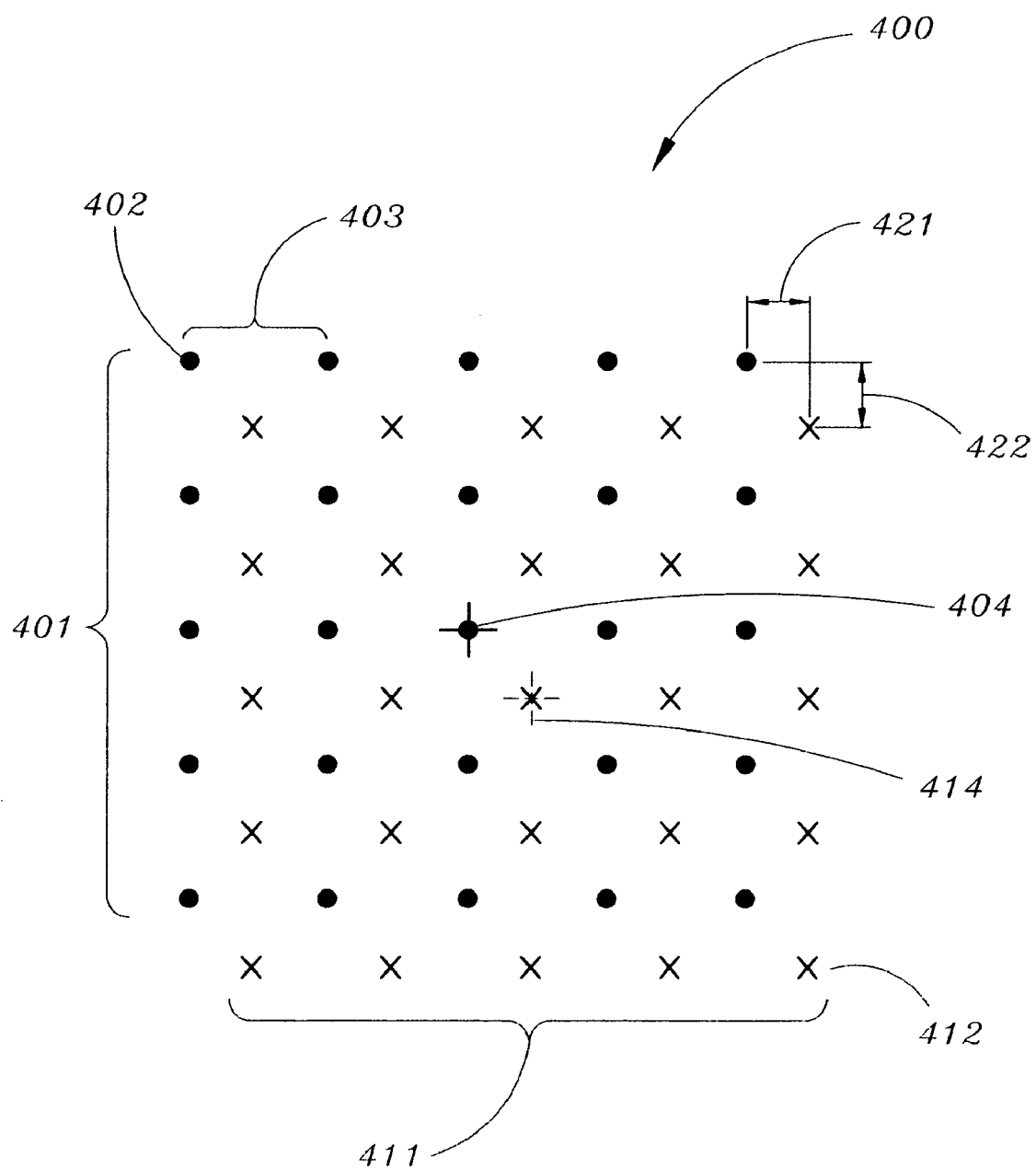
FIG. 4 is another simplified depiction of an OVL encoding bloc embodiment in accordance with the principles of the invention.

FIG. 4 provides a simplified example of how the first arrangement may be configured. The OVL bloc 400 may include a first array 401 including a symmetrical arrangement of OVL features 402 (represented by the depicted dots). The features 402 of the first array 401 have a first pitch 403 in both the x and y directions. This pitch need not be the same in both directions, but in some embodiments a uniform pitch in both directions may be advantageous. The first array 401 may define a first center of symmetry 404. Also, the OVL bloc 400 may include a second array 411 including a similar symmetrical arrangement of OVL features 412 (represented by the depicted "x"s). The OVL features 412 of the second array 411 have the same pitch as pitch 403 of the first array. Again, the pitch is present in both the x and y directions. Additionally, the pitches may match those of the first array in both directions. The second array 411 may define a second center of symmetry 414. Additionally, the two patterns may be designed with a known and intended known offset in each perpendicular direction. This may be depicted by the x and y offsets (respectively 421 and 422) shown here. This may also be indicative of the offset between the centers of symmetry 404, 414. The variance from this known offset may be detected and used to characterize the overlay error in a selected portion of the surface. This implementation may be referred to herein as a discrete OVL bloc where there may be uniform pitch in both layers and a single offset. Overlay measurements may be made for determining the overlay error in the area of the dummy field corresponding to the affected bloc. This may be distinguished from a continuous OVL pattern embodiments described below.

Figure 5A:
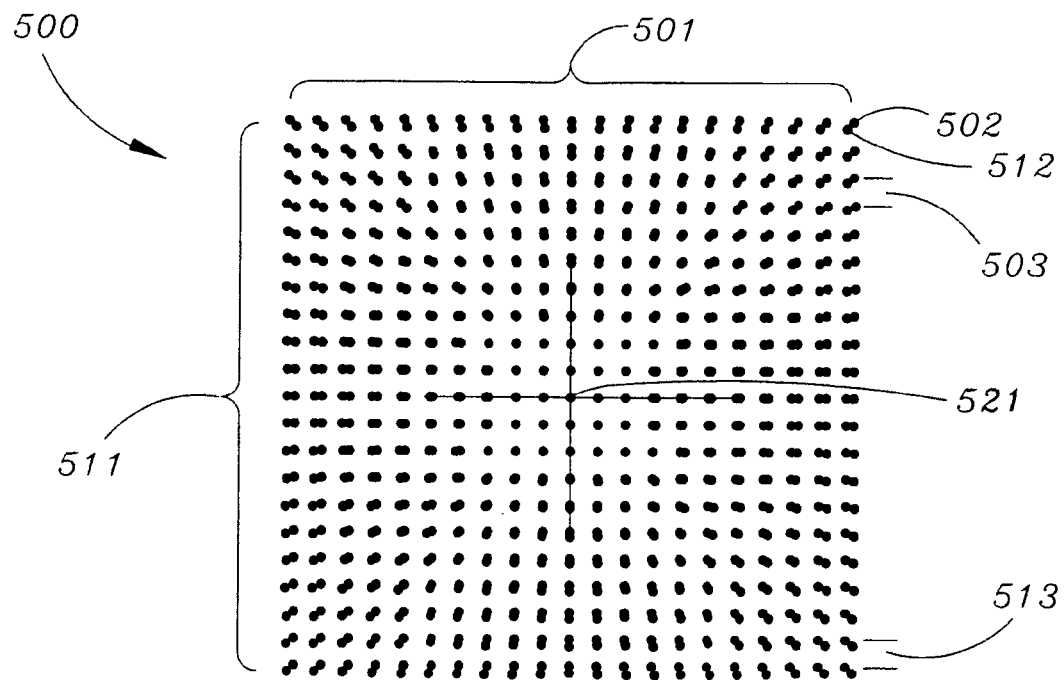
FIG. 5(a)-5(b) are simplified diagrams of OVL encoding blocs and the associated shifting patterns and movement of the mutual center of symmetry in accordance with one embodiment of the invention.

In the second case, the enhanced dummy field may include two arrays formed on two associated layers corresponding to the different process layers. In this case, the features of each array may be formed with slightly different pitches as shown in FIG. 5(a). FIG. 5(a) is a simplified depiction of one embodiment of a continuous OVL bloc 500. In this context, "continuous" may refer to two layers of array features with differing periodicities arranged such that the offset between the two layers may continuously vary over the surface of the OVL bloc 500. The OVL bloc 500 may include a first array 501 including a symmetrical arrangement of OVL features 502 (represented by the depicted dark dots) with a first pitch 503 in both the x and y directions. This pitch need not be the same in both directions. However, some embodiments may include uniform pitch in both directions. Additionally, the OVL bloc 500 may include a second array 511 including a similar symmetrical arrangement of OVL features 512 (represented by the depicted gray dots). The features 512 of the second array 511 may have a second pitch 513 that is different from the pitch 503 of the first array. Again, the pitch is present in both the x and y directions. As designed, the first and second arrays may share a mutual center of symmetry 521 (depicted by the cross), which in FIG. 5(a) is depicted near the center of the OVL bloc 500. In this depiction, the arrays may be designed so that a mutual center of symmetry 521 occurs at a point where the central features (the dots) of each array are coincident. During fabrication, the layers may become misaligned and may define a new (or actual) center of symmetry.

The distance between the intended center of symmetry ("nominal" center of symmetry) and the actual center of symmetry (the measured or "observed" center of symmetry) may define the offset between the two layers. This offset may be detected and used to characterize the overlay error at each selected point of the enhanced dummy field.

With continued reference to FIG. 5(a), a first layer may include a first array 501 of features 502 having a first pitch $p_1$ 503. A second layer, formed over the first layer, may include another array 511 of features 512 having a second pitch $p_2$ 513. The second layer may be transmissive at the wavelengths of examination so that both the first and second layers may be illuminated, and the first and second arrays may be measured in order to determine OVL offset between the layers. In FIG. 5(a), the OVL blocs may be depicted with the nominal mutual center of symmetry (e.g., defined by the center of the cross 521). The mutual center of symmetry defines a point in the two arrays about which the two array patterns are mutually symmetric.

Figure 5B:
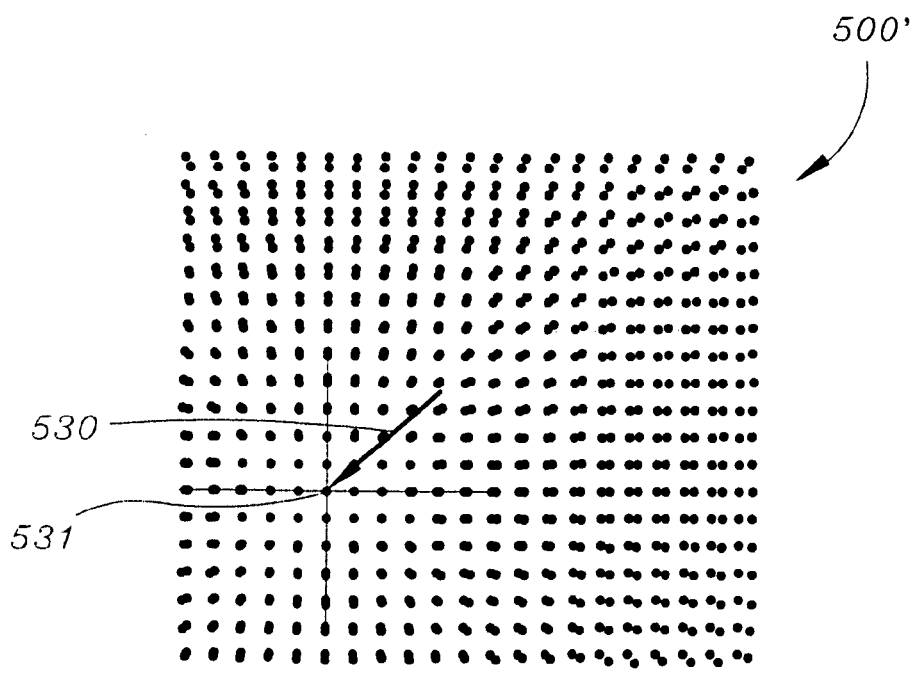

The technology disclosed herein enables fast and accurate determination of overlay error between layers. In continuing the discussion of FIG. 5(a), an example of how the enhanced dummy field may be used to measure overlay error is shown. As shown in FIG. 5(b), deviation from perfect overlay alignment may be captured by the changes to the pattern of the OVL bloc 500' after fabrication. As the overlay changes, the alignment between arrays 501, 511 formed in the first and second Layers also changes. This change in alignment defines a new mutual center of symmetry 531 in accordance with the alignment of the Layers. This new mutual center of symmetry 531 may be the observed mutual center of symmetry (the actual mutual center of symmetry), which is at variance from the nominal mutual center of symmetry (i.e., the intended mutual center of symmetry 521 shown in FIG. 5(a)). The difference between the observed center of symmetry and the nominal center of symmetry, depicted schematically by arrow 530, may define the overlay error for a given point in the wafer 200. The depicted OVL bloc may enable easy measurement of overlay error in both the x and y dimensions. The measurement of this shift enables the detection of overlay errors. This will be discussed below in detail.

An enhanced dummy field may be filled with a repeating sequence and/or patterns of many thousands (or even millions) of OVL blocs. Sizes for these OVL blocs run generally in the range of about 5-10 micrometers ($\mu m$) square (this being about the smallest effective illumination light spot size) with no upper limit on size. However, it may be useful to use OVL blocs in the range of about 1×1 $mm^2$ and/or 2×2 $mm^2$, with operational OVL blocs often as Large as about 10×10 $\mu m^2$. However, it has been found that the smaller the size of the OVL bloc, the less variance in the overlay over its surface. However, there is theoretically no upper limit on size.

The enhanced dummy field may include a series of OVL blocs having a desired coarse pitch and desired fine pitches. The "coarse pitch" may define the size of the OVL bloc and the fine pitches may be defined by the spacing between the features of the OVL bloc. Thus, for each OVL bloc, a coarse pitch may be defined as the size of the OVL bloc and the fine pitch may be the pitch between the individual features of the OVL bloc. The ratio of coarse pitch to fine pitch may define the gain for the OVL bloc. Additionally, because all error sources are divided by the gain, having a high gain may be advantageous. In one embodiment, a gain of at least 10-20 is suitable (100-400 features per block in this case). However, gains of 1000 or greater may be even more advantageous. For example, a fine pitch of 1 $\mu m$ and a gain of 1000 may be chosen resulting in a bloc size of about 1 mm×1 mm. The enhanced dummy field may contain thousands of these blocs.

In one example implementation, the fine pitch of a first layer of an OVL bloc may be chosen as 500 nm with the second layer having a different pitch of 550 nm. Thus, the OVL bloc may have layers with two different pitches with the range of offsets becoming larger extending away from the point of mutual symmetry. The bloc size may be defined by the relation $p_1 * p_2/(p_2-p_1)$. Accordingly, the above bloc is 500*550/(550−500) resulting in repeating patterns every 55 $\mu m$. Thus, each pattern may define a bloc of about 55 $\mu m$×55 $\mu m$. In order to obtain greater resolution, the difference between the pitches ($\Delta p$) may be made smaller. However, this may be at the expense of a greater range (i.e., to obtain high resolution, the ability to measure larger overlay errors is sacrificed). In order to capture a wider range of overlay error magnitudes, a larger ($\Delta p$) may be used, but at the cost of reduced resolution. In some embodiments, the enhanced dummy field may include areas of greater and lesser range to enable the capturing of both high resolution data and a wide range of overlay sensitivity. This task may be made easier if the approximate range of expected overlay error is known beforehand.

Once a suitable enhanced dummy field is designed, it may be automatically incorporated into the existing semiconductor design. The active circuit pattern may be simply introduced into the dummy field. In an example, the actual patterned devices, circuits, and/or features may be placed over the dummy pattern and may overwrite the dummy pattern. Thus, unlike dedicated targets which must have specific placement and distribution, the enhanced dummy pattern may be virtually everywhere on the wafer except where purposely excluded (e.g., where the actual operative wafer circuitry is to be formed). This may have the advantage of being able to capture overlay information from almost any general area on the wafer. This advantageously includes location where targets cannot be formed. This approach does not require any substantial design change in the circuitry pattern as it merely "writes" over the dummy field in the places where such circuitry is to be formed. Virtually all portions of the wafer that do not contain active circuitry may accommodate the dummy field.

Figure 6:
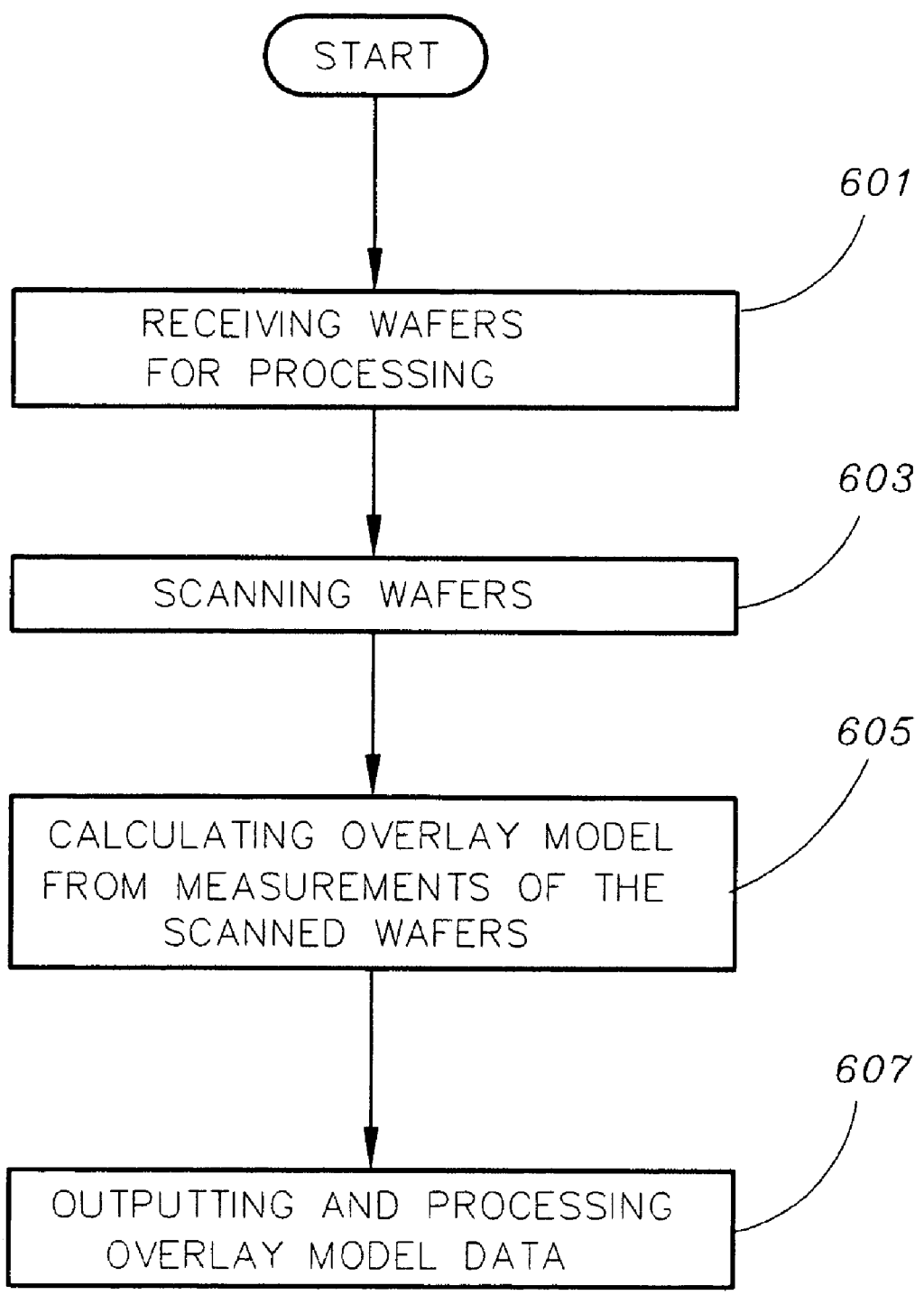
FIG. 6 is a simplified flow diagram illustrating process aspects of the invention.

Once the enhanced dummy field is incorporated into the design, the patterns, including dummy field and active patterns on each layer, may be formed on the substrate. The wafer may be inspected for determining overlay error at various portions of a die and/or the wafer. FIG. 6 provides a simplified flow diagram that illustrates aspects of this inspection process. In summary, operation 601 discloses a process for inspecting the wafer begins by receiving a wafer having the layers formed thereon (including the enhanced dummy pattern). Once the received wafer is positioned on an inspection apparatus, operation 603 discloses scanning to obtain overlay measurements from various points of the enhanced dummy field. Operation 605 discloses using the measurements obtained from the dummy field to calculate overlay error for a variety of locations across a wafer or die. Operation 607 discloses outputting and/or processing overlay model data as various outputs including, but not limited to, generating overlay models of the surface, dispositioning wafers, generating and providing a set of correctibles suitable for wafer rework or process adjustment.

A user may introduce the enhanced dummy pattern into any existing circuitry pattern or vice versa. The template of active circuit elements to be formed may be overlaid over the enhanced dummy pattern so that the enhanced dummy pattern does not interfere with the pattern used to form the active pattern. Thus, the dummy pattern may be formed anywhere that the active circuit elements are not. This may be advantageous because it enables the formation of the enhanced dummy pattern without regard for the active circuit pattern. Additionally, a previous circuit pattern requires essentially no changes to its pattern in order to accommodate the dummy field. The only thing required is that the active circuit design file be integrated into the dummy pattern file. Alternatively, the active pattern may be formed directly over the design pattern or vice versa such that the resultant pattern produced on the wafer contains the desired circuit pattern and/or the dummy field in all the desired interstitial spaces. Other methods of pattern construction may be implementable as well. A number of fabrication techniques and processes may be used to form suitable enhanced dummy patterns.

Figure 7A:
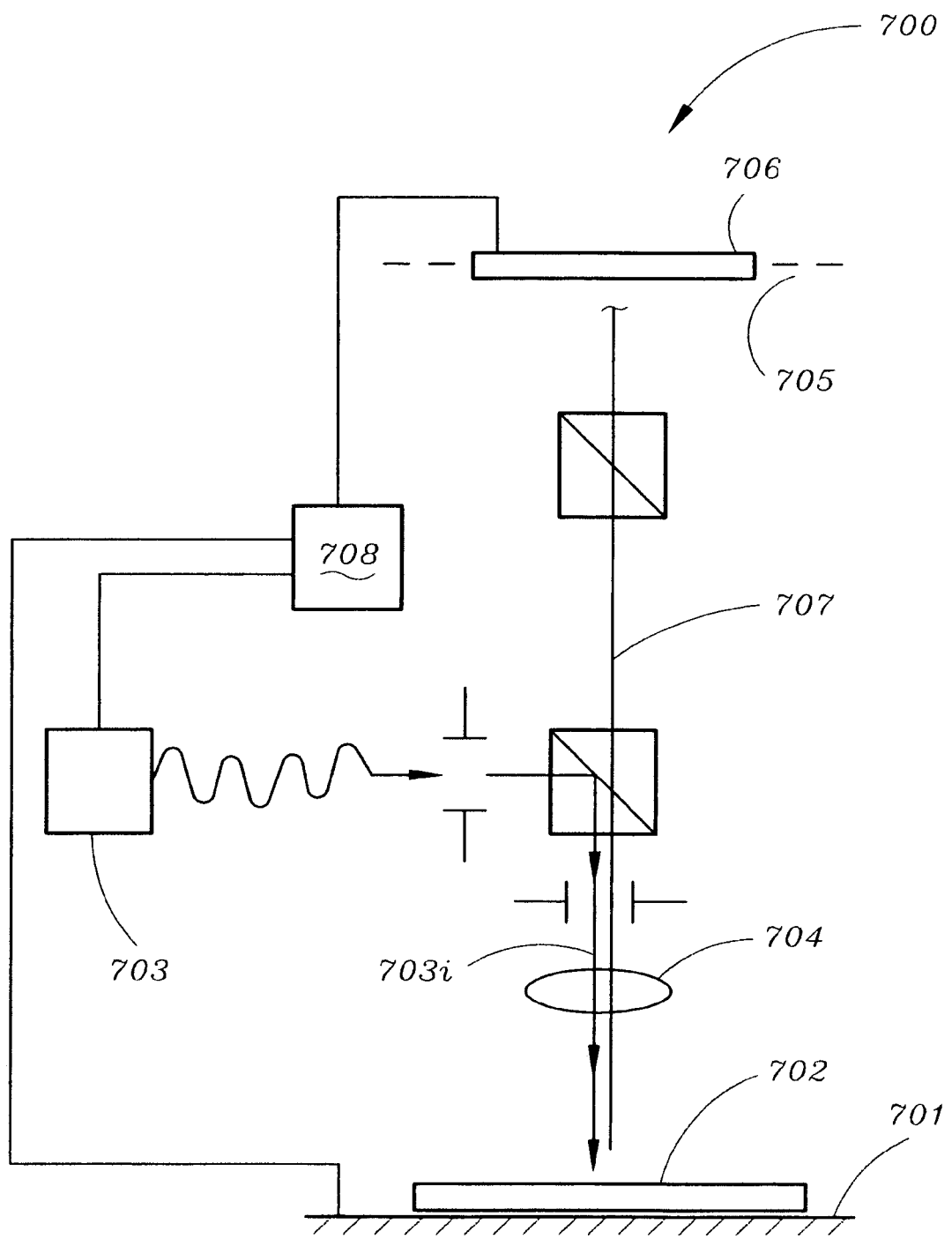
FIG. 7(a) is a simplified depiction of an apparatus suitable for measuring overlay in accordance with the principles of the invention.

As disclosed in operation 601, the received pattern wafer may be loaded into a suitable inspection apparatus. FIG. 7(a) is a schematic depiction of one example of such an inspection apparatus. This implementation is not intended to be limiting, only illustrative. The apparatus 700 may include a stage upon which a wafer 702 under test is secured. The stage may be an x-y stage, a rotating stage, or any other suitable implementation in one embodiment, the stage may include a rotating stage that enables continuous rotation and scanning of the wafer. Such a rotating stage may enable an entire wafer to be scanned in a very short period of time. In another embodiment, an illumination beam 703i may be moved relative to the substrate for scanning a wafer. An optical source 703 may be positioned to direct an optical beam onto an exposure site on the wafer 702. The illumination beam 703i may be directed to a desired location using free space, waveguides, and/or any suitable optical elements. The optical source 703 may include a monochromatic device such as a laser (e.g., a 157 nm fluorine (F2) laser) or in other cases a suitably filtered polychromatic source. For example, a broadband source in conjunction with spectrophotometers may be utilized to enable overlay metrology measurements. Additionally, optical source 703 may include multiple illumination beams operating at different wavelengths. This may enable the inspection of a broad range of substrates and layers formed on the substrate. Further, this may enable the inspection of a wide range of material layers and complicated stack architectures.

Imaging optics 704 may be arranged to capture signal 707, sometimes referred to as the asymmetry signal, from the surface of the selectively illuminated wafer 702. Because the invention measures light intensity, it may have substantially fewer focus constraints than might be expected. As a result, the cost of the device may be considerably reduced.

Figure 7B:
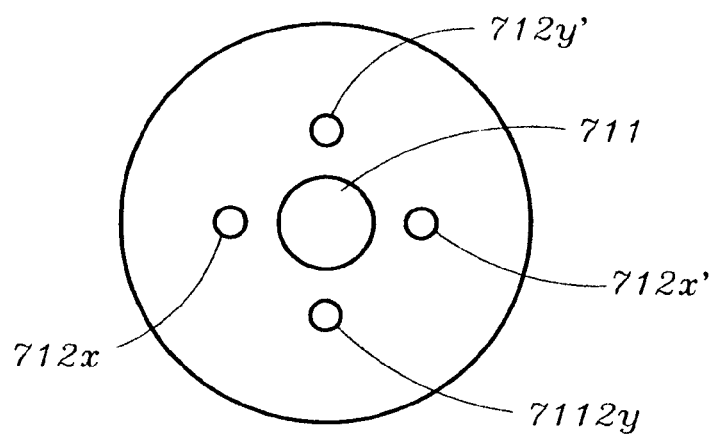
FIGS. 7(b) & 7(c) are simplified illustrating various illumination pupils arranged in a pupil plane in accordance with some embodiments of the invention.
Figure 7C:
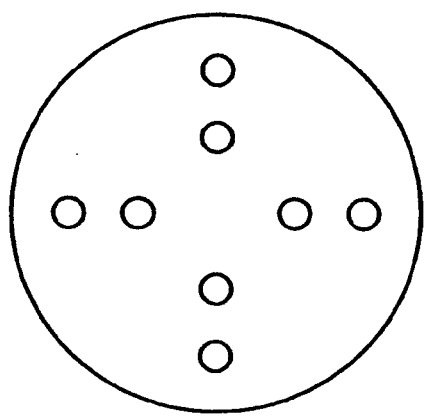

The system may include detector 706 arranged at or near pupil plane 705. In the case where the illumination source 703 is a broadband source, the detector 706 may include a spectrophotometer configured to examine signal 707 at several different wavelengths or bandwidths. Additionally, when used with monochromatic source 703, detector 708 includes at least one optical pupil arranged in pupil plane 705 and configured to enable the characterization of signal 707 received from surface through the optical system. FIGS. 7(b)-7(c) depict a few of many possible pupil arrangements suitable for use in accordance with a monochromatic source. As shown in FIGS. 7(b)-7(c), the at least one pupil may be arranged in a diffraction sensitive filter element. In the implementation shown in FIG. 7(b), the at least one pupil may include a central aperture 711 for passing zero order light and a set of apertures arranged to enable measurement of a filtered asymmetry signal (here comprising first order diffraction signals ($712x$, $712x'$, $712y$, $712y'$)). A set of pupils so arranged may capture selected x and y asymmetry signals. For example, pupils $712x$, $712x'$ may be arranged to capture x-oriented asymmetry signals with pupil $712x$ arranged to capture positive first order "x" asymmetry signals and complementary pupil $712x'$ arranged to capture negative first order "x" asymmetry signals. Also, pupils $712y$, $712y'$ may be arranged to capture y-oriented asymmetry signals with pupil $712y$ arranged to capture positive first order "y" asymmetry signals and complementary pupil $712y'$ arranged to capture negative first order "y" asymmetry signals. Additionally, higher order asymmetry signals may be captured. Various combinations of 1st 2nd, 3rd, and higher order signals may be captured and processed in various combinations to obtain valuable information concerning the overlay. Additionally, various embodiments may optionally use zero order light. The asymmetry signals may be measured to capture intensity data, phase information, and various diffraction order signals to best characterize overlay. FIG. 7(c) shows one embodiment having a group of pupils arranged to capture, for example, first order and second order "x" and "y" diffraction signals. In some embodiments, a zero order light intensity signal collected through central pupil 711 may be used to discriminate between signals. An example of such discrimination may be found below.

Referring again to FIG. 7(a), sensors 706 may detect signal 707 passing through the apertures (pupils). These detected signals may be processed (e.g., by a processor 708) to determine overlay measurements. Advantageously, the processed signal may be used to generate "on-the-fly" (i.e., as measurements are taken) a model of overlay for the substrate. In some embodiments, the processor 708 may be used to further control apparatus 700 including, but not limited to the optical source 703, the movement off the substrate 702 relative to the illumination signal 703i, and the like.

Referring again to operation 603, once the substrate is placed in the inspection apparatus, the substrate may be scanned. This may be accomplished in a number of different ways. First, the design files (e.g., the .gdi files, etc.) used to form the layers formed on the substrate may be analyzed to delineate an optimal inspection path. For example, a path may be defined that arranges a specific inspection path that illumination beam 703i may trace over the substrate surface. The path may include a substantial portion of the enhanced dummy field and/or may be configured so that the distribution of measurements taken is spread over a wide area of the substrate for enabling the measurements to accurately characterize the overlay of the entire substrate surface. In another embodiment, the scanning may be done without particular reference to the placement of the dummy pattern.

Figure 7D:
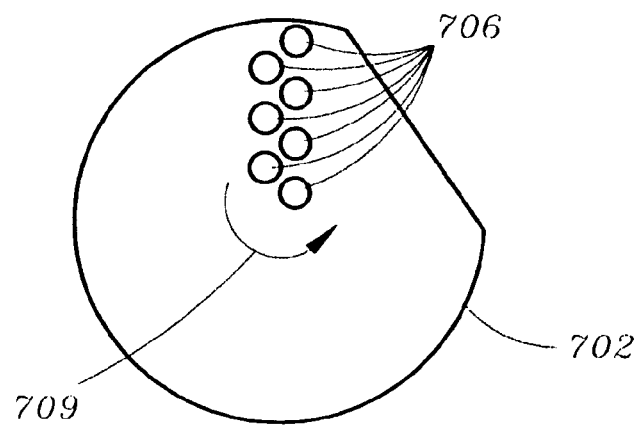
FIG. 7(d) is a simplified plan view depiction of an apparatus suitable for measuring overlay in accordance with an principles of the invention.

In an embodiment, a scanning pattern may be conducted in the most expedient fashion and the zero order signal may be monitored. In general, when the illumination beam 703i impinges on active circuit elements and patterns, there may be a higher intensity signal received including an associated higher degree of zero order signal and a relatively lower degree of diffraction. Conversely, when the dummy pattern is illuminated, the zero order signal intensity may be reduced and the proportion of diffracted signal may increase relative to that of the zero order signal. Thus, if using a method sensitive to absolute intensity, the high intensity signals may be disregarded or de-emphasized as not representative of the dummy field and screened out of overlay measurements. In an embodiment, this may be easily accomplished using a monochromatic source and an arrangement enabling detection signal intensity. For example, the pupil plane arrangement of FIG. 7(b) would be suitable as pupil 711 may be used for measuring absolute signal intensity. In one example, when the absolute signal intensity reaches a preset threshold, the signal from the surface may then be associated with active circuit patterns. When the signal is not in compliance with the threshold, it may be determined that the signal impinges on the dummy field in the inspected area. This may enable an accurate determination of overlay for areas of the surface in relation to the .gdi file to set the scan path. These scanning processes may be extremely quick. In some implementations, scanning may take as approximately 15 seconds for an entire wafer. FIG. 7(d) includes a depiction of one embodiment that may quickly capture measurements characterizing the entire surface of the substrate. For example, FIG. 7(d) provides a simplified top down schematic view of a substrate under inspection. In the depicted embodiment, the apparatus may include many sensors 706 arranged to image the surface of the substrate 702. In some embodiments, the sensors 706 may be arranged so that the entire surface may be measured in as little as one rotation 709 of the substrate.

As recited by operation 605, as data is captured from the illuminated substrate, calculations may be made for determination of overlay at different points on the substrate. Such calculations may be in accord with a number of models used to characterize overlay on surfaces. In one embodiment, the measured signal may define an unknown value that may be approximated by a 10-15 term polynomial or even a shortened polynomial requiring only 4-6 terms for defining the real offset. For example, Eqn. 1 illustrates one suitable model (where the $A_n$ coefficients are unknown).

$$I = A_o + A_1\cos\left\{\frac{2\pi}{P}OVL\right\} + \\ A_2\cos\left\{\frac{4\pi}{P}OVL\right\} + A_3\left\{\frac{6\pi}{P}OVL\right\} + A_4\left\{\frac{8\pi}{P}OVL\right\} + \ldots \quad \text{Eqn. 1}$$

Additionally, where values for x are unknown, the actual overlay (OVL), f{i} may be the predefined OVL offsets for each local area. By determining the unknown coefficients, the actual OVL may be determined using algorithms, and/o appropriate equations, for example Eqn. 2.

$$I_i = A_0 + A_1\cos\left\{\frac{2\pi}{P}(x+f_i)\right\} + \\ A_2\cos\left\{\frac{4\pi}{P}(x+f_i)\right\} + A_3\cos\left\{\frac{6\pi}{P}(x+f_i)\right\} + \ldots \quad \text{Eqn. 2}$$

Intensity values at various local areas (1, . . . , n) may be used to approximate the values for A and the measurements may be used to calculate an overlay model of the wafer surface. An overlay model may be for the wafer level and/or the die level. Additionally, such models may be more particularized or situation appropriate depending on the needs of the user.

As disclosed by operation 607, once the measurements are made and collected and the calculations are performed for obtaining a suitable model of the substrate surface, the information may be output for further processing. For example, the information may be used for dispositioned wafers in order to determine whether reworking is necessary. Additionally, the information may be used for generating a set of correctibles, which may be used by the apparatus to improve fabrication processes and parameters implemented in subsequent wafer fabrication operations.

Figure 8A:
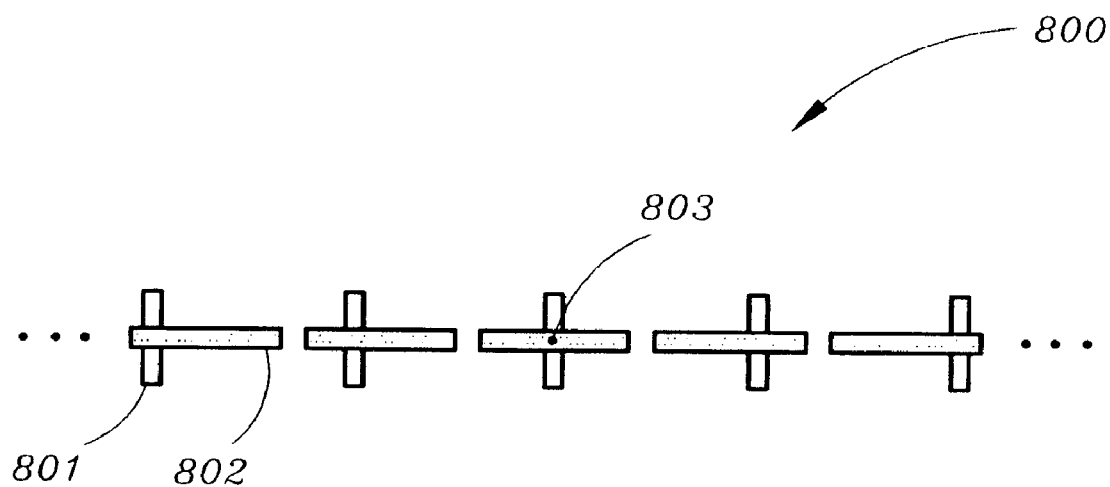
FIGS. 8(a)-8(b) are simplified diagrams of another OVL encoding bloc embodiment and the associated shifting off patterns and in accordance with one embodiment of the invention.
Figure 8B:
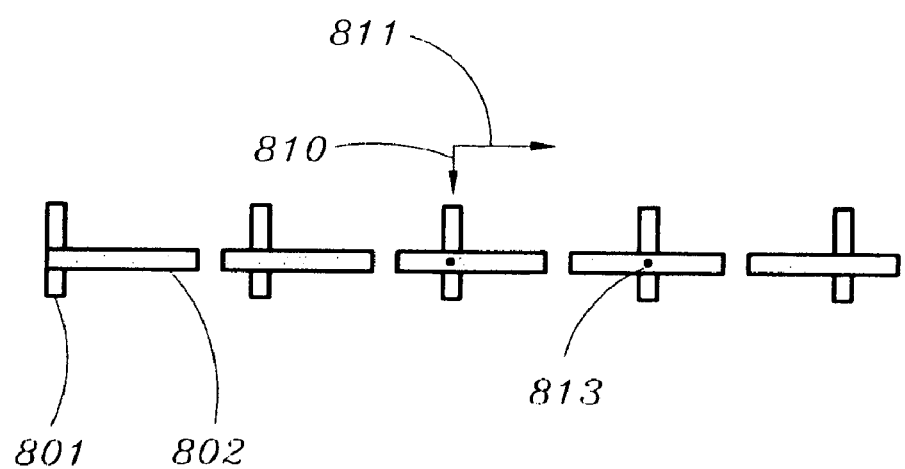

FIGS. 8(a) and 8(b) illustrate an aspect of an enhanced dummy field. The simplified field 800 depicted in FIGS. 8(a) and 8(b) may be extended to cover an entire dummy field area of the relevant layers of an inspected substrate. In FIG. 8(a), a portion of the enhanced dummy field 800 is depicted having a first pattern of spaced apart metrology features 801 formed in a first layer. As discussed previously, these features may be regularly spaced having a first pitch. A second layer may be formed over the first layer having a second pattern of spaced apart metrology features 802. In this embodiment, the features of the second pattern may be spaced apart with a second pitch different than that used in the first set of features 801. For example, the features may be a set of bar-shaped elongate features. These may be trenches, pillars, lines, or features that are in contrast with the surrounding material of the layer they are formed in. The spacing between features may be center to center spacing between features or any other convenient measure. In FIG. 8(a), the features are shown with a nominal mutual center of symmetry 803 for the arrays 801, 802. It is noted that although only five features from each array are shown, the arrays may comprise many more features extending both in the x and y directions. In general, the features of one layer may be made at right angles to the feature of the other layer.

This dummy field 800 may be used in a manner similar to those described above for measuring overlay in small areas. In the example depicted in FIG. 8(b), the shift in position of the layers is illustrated by the shift in the pattern of the arrays 801, 802. The observed pattern shows the shift of the second pattern 802 down 810 and to the right 811 relative to the first pattern 801 defining an observed mutual center of symmetry 813 for the two arrays 801, 802.

Among the many advantages of this approach include the fact that simple optics may be used rather than requiring expensive focusing optics required in the prior art. This may be due to a theoretically infinite depth of field for the system. Moreover, due to the high gain possible with such systems (e.g., gains of 20 to over 10,000), the effects of small optical aberrations may be rendered unimportant. Because the sensors can be reduced to pin diodes in simplest form, an extremely high throughput is possible enabling real-time processing of data. Thus, only minimal, if any, post processing is ever needed. Additionally, the results may be known almost as soon as the measurements are made. The stage requirements may be re actively relaxed compared to other approaches known to those having ordinary skill in the art. All that is required is that the stage be quick and responsive. Thus, a high speed rotary stage may be particularly suitable. There is no need to stop, focus, and then measure, as is the case with target driven systems. The combination of a high speed stage and advanced measurement methodology enables wafers to be inspected in a time scale of on the order of about 15 seconds per wafer instead of many minutes per wafer, as is the case with known methods. This high throughput capability is not matched with any of the high precision metrology tools known in the art. An additional advantage includes the ability to design OVL targets in advance for a whole active area opposed to designing OVL targets around already existing devices.

The technology disclosed herein demonstrates many improvements over the state of the art and satisfies many of the needs in the industry as expressed in the foregoing paragraphs. Additionally, the present technology has been particularly shown and described with respect to certain preferred embodiments and specific features thereof. However, it should be noted that the above-described embodiments are intended to describe the principles of the technology, not limit its scope. Therefore, as is readily apparent to those of ordinary skill in the art, various changes and modifications in form and detail may be made without departing from the spirit and scope of the technology as set forth in the appended claims. Other embodiments and variations to the depicted embodiments will be apparent to those skilled in the art and may be made without departing from the spirit and scope of the technology as defined in the following claims. In particular, it is contemplated that many different metrology features, defect feature arrangements, and configurations may be established for targets constructed in accordance with the principles of the technology. Although only a few configurations are expressly disclosed herein, it should be appreciated by anyone having ordinary skill in the art that, using the teachings disclosed herein, many different configurations may be implemented and still fall within the scope of the claims. Further, reference in the claims to an element in the singular is not intended to mean "one and only one" unless explicitly stated, but rather, "one or more". Furthermore, the embodiments illustratively disclosed herein may be practiced without any element that is not specifically disclosed herein.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method may be rearranged while remaining within the disclosed subject matter. The accompanying method claims present elements of the various steps in a sample order and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A semiconductor wafer having one or more dummy field regions configured to enable overlay measurements, comprising:
    a substrate including a plurality of die patterning regions;
    a set of semiconductor circuitry structures formed on the substrate, one or more of the semiconductor circuitry structures forming a plurality of actively patterned regions; and
    one or more dummy field regions patterned with periodic overlay features encoded with overlay alignment information, the one or more dummy field regions being formed on the substrate, a first portion of the one or more dummy fields formed on a first process layer, at least a second portion of the one or more dummy fields formed on at least a second process layer, the one or more dummy field regions formed in one or more non-active regions of each of the die patterning regions of the substrate, each of the die patterning regions further including one or more of the actively patterned regions, the one or more dummy field regions formed within one or more interstitial spaces between two or more of the actively patterned regions of each of the die patterning regions, the plurality of actively patterned regions formed over the one or more dummy field regions.

2. The semiconductor wafer having one or more dummy field regions configured to enable overlay measurements in claim 1, wherein the first portion of the one or more dummy fields formed on the first process layer has a first pitch and the at least a second portion of the one or more dummy fields formed on the at least a second process layer has a second pitch different from the first pitch.

3. The semiconductor wafer having one or more dummy field regions configured to enable overlay measurements in claim 1, wherein the one or more dummy fields comprise:
    one or more dummy fields configured to extend over substantially all of the substrate surface.

4. The semiconductor wafer having one or more dummy field regions configured to enable overlay measurements in claim 1, wherein the one or more dummy fields comprise:
    one or more dummy fields configured as a background pattern.

5. The semiconductor wafer having one or more dummy field regions configured to enable overlay measurements in claim 1, wherein the one or more dummy fields comprise:
    one or more dummy fields having a density similar to one or more adjacent actively patterned regions.

6. The semiconductor wafer having one or more dummy field regions configured to enable overlay measurements in claim 1, wherein the one or more dummy fields comprise:
    one or more dummy fields including a plurality of OVL encoding blocs.

7. The semiconductor wafer having one or more dummy field regions configured to enable overlay measurements in claim 1, wherein the one or more dummy fields comprise:
    one or more dummy fields including an OVL bloc smaller than an illuminating beam size.

8. The semiconductor wafer having one or more dummy field regions configured to enable overlay measurements in claim 1, wherein the one or more dummy fields comprise:
    one or more dummy fields having at least one OVL feature including at least one of a pillar, a via, a dot, a bar, a square, or a triangle.

9. The semiconductor wafer having one or more dummy field regions configured to enable overlay measurements in claim 1, wherein the one or more dummy fields comprise:
    one or more dummy fields including two arrays formed on two associated layers corresponding to different process layers.

10. The semiconductor wafer having one or more dummy field regions configured to enable overlay measurements in claim 1, wherein the one or more dummy fields comprise:
    one or more dummy fields having a uniform pitch in the x direction and the y direction.

11. The semiconductor wafer having one or more dummy field regions configured to enable overlay measurements in claim 1, wherein the one or more dummy fields comprise:
    one or more dummy fields having at least one OVL bloc between about 5 $\mu m^2$ and about 10 $\mu m^2$.

12. A method of measuring the overlay in a semiconductor substrate, the method comprising;
    providing a substrate having a first layer formed over a second layer, the layers including an encoded one or more dummy field regions with microcircuitry structures formed therein, the encoded one or more dummy field regions comprising two overlying periodic patterns arranged on the first and second layers respectively to form OVL encoding patterns suitable for two dimensional overlay metrology measurements, the one or more dummy field regions formed in one or more non-active regions of each of a plurality of die patterning regions of the substrate, each of the die patterning regions further including one or more of actively patterned regions, the one or more dummy field regions formed within one or more interstitial spaces between two or more of the actively patterned regions of each of the die patterning regions;

continuously scanning an optical sensor relative to the substrate to enable overlay measurements of the OVL encoded patterns of the one or more dummy field regions;

illuminating the one or more dummy field regions to produce asymmetry signals associated with OVL encoded patterns at various positions in the one or more dummy field regions;

capturing the asymmetry signals with the optical sensor; and processing the signals to determine overlay offset between the first layer and the second layer and generating a map of overlay offset as a function of position on the substrate.

13. The method for measuring the overlay in a semiconductor substrate in claim 12, wherein providing a substrate comprises:

encoding at least a substantial portion of the substrate with overlay information.

14. The method for measuring the overlay in a semiconductor substrate in claim 12, wherein providing a substrate comprises:

Incorporating one or more dummy field regions and subsequently incorporating an active circuit pattern.

15. The method for measuring the overlay in a semiconductor substrate in claim 12, wherein capturing the asymmetry signals with the optical sensor comprises:

capturing the asymmetry signals produced by the substrate without changing focus between measurements.

16. The method for measuring the overlay in a semiconductor substrate in claim 12, wherein capturing the asymmetry signals with the optical sensor comprises:

measuring for about fifteen seconds.

17. The method for measuring the overlay in a semiconductor substrate in claim 12, wherein processing the signals to determine overlay offset comprises:

processing in at least one of real time or near real time.

18. The method for measuring the overlay in a semiconductor substrate in claim 12, wherein processing the signals to determine overlay offset comprises:

determining a degree of offset between a first center of symmetry in a first layer and a second center of symmetry in a second layer.

19. An overlay metrology apparatus that enables the measurement of overlay error in a substrate, the apparatus comprising:

an examination platform configured to secure a wafer, the wafer including one or more dummy field regions encoded with overlay alignment information, a first portion of the one or more dummy fields formed on a first process layer, at least a second portion of the one or more dummy fields formed on at least a second process layer, the one or more dummy field regions formed in one or more non-active regions of each of the die patterning regions of the substrate, each of the die patterning regions further including one or more of the actively patterned regions, the one or more dummy field regions formed within one or more interstitial spaces between two or more of the actively patterned regions of each of the die patterning regions, the plurality of actively patterned regions formed over the one or more dummy field regions;

an illumination system configured to illuminate one or more portions of the wafer with a light beam, the apparatus configured to translate the wafer such that different portions of the wafer are illuminated to generate an optical signal associated with surface patterns of the wafer under inspection, wherein said optical signal defines an asymmetry signal;

an optical system configured to continuously receive the asymmetry signal as the light beam moves across the wafer; and a detection system arranged to receive the asymmetry signal from the optical system, the detection system configured to determine layer overlay on the wafer using the detected asymmetry signal, the detection system including at least one optical pupil positioned at least substantially at a pupil plane.

20. The apparatus in claim 19, wherein the examination platform comprises:

a movable stage.

21. The apparatus in claim 19, further comprising:

one or more diffraction sensitive filter elements, the one or more diffraction sensitive filter elements positioned substantially in the at least one optical pupil of the detection system.

\* \* \* \* \*